(12) United States Patent
Knauer

(10) Patent No.: US 7,342,401 B2
(45) Date of Patent: Mar. 11, 2008

(54) MEASUREMENT BIAS TEE

(75) Inventor: William Knauer, Chagrin Falls, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 0 days.

(21) Appl. No.: 11/177,566

(22) Filed: Jul. 8, 2005

(65) Prior Publication Data

US 2007/0007972 A1    Jan. 11, 2007

(51) Int. Cl.
*G01R 27/26* (2006.01)
(52) U.S. Cl. ............................ 324/677; 324/637
(58) Field of Classification Search ............... 324/677, 324/637
See application file for complete search history.

(56) References Cited

U.S. PATENT DOCUMENTS

| 6,396,298 | B1 * | 5/2002 | Young et al. ............... 324/769 |
| 6,657,522 | B2 * | 12/2003 | Buber et al. ................ 333/245 |
| 2006/0022771 | A1 * | 2/2006 | Daxiong ..................... 333/185 |

OTHER PUBLICATIONS

Efficient Microwave Bias and Testing Using the HP 4142B Modular DC Source/Monitor. Hewlett Packard. Application Note 1205 (No Month/Date/Year availble).*

* cited by examiner

*Primary Examiner*—Vincent Q Nguyen
(74) *Attorney, Agent, or Firm*—Pearne & Gordon LLP

(57) ABSTRACT

A bias tee for connecting a measurement device to a DUT, where the measurement device has a guard output, includes a DC port; a HF port; and a measurement port. The HF input port is guarded with the guard output during operation of the bias tee.

7 Claims, 2 Drawing Sheets

MEASUREMENT BIAS TEE

BACKGROUND OF THE INVENTION

The present invention relates to the measurement of electrical signals and, in particular, to bias tees used therein.

The use of bias tees in measurements is well-known. Referring to FIG. 1, a prior art bias tee 10 is used to connect a DC instrument 12. (e.g, a source measurement unit) and a high frequency (HF) instrument 14 to a device under test 16 (DUT). The HF instrument 14 may be, for example, a combination RF signal generator and measurement device. It should be noted that the bias tee 10 can also be used in the case of pulses as opposed to radio frequency signals per se, the frequency content of typical interest being similar.

The typical purpose of the bias tee 12 is to allow the simultaneous application of HF and low frequency (e.g., DC) signals to the DUT 16. At the same time, DC signals are blocked from the instrument 14 and HF signals are blocked from the instrument 12. For example, the DC signals may serve to bias the DUT while it responds to RF signals, hence the name, bias tee.

The example of FIG. 1 includes both a source path 18 and a measure path 20, so that a so-called Kelvin connection can be made to the DUT to improve measurement performance with respect to the low frequency signals.

Unfortunately, the bias tee 10 introduces its own measurement errors, for example, leakage and stray capacitances. This particularly creates challenges in making very accurate and/or very sensitive measurements (e.g., pico- and femto-ampere measurements).

SUMMARY OF THE INVENTION

A bias tee for connecting a measurement device to a DUT, where the measurement device has a guard output, includes a DC port; a HF port; and a measurement port. The HF input port is guarded with said guard output during operation of the bias tee.

DESCRIPTION OF THE PREFERRED EMBODIMENTS

Figure 2:
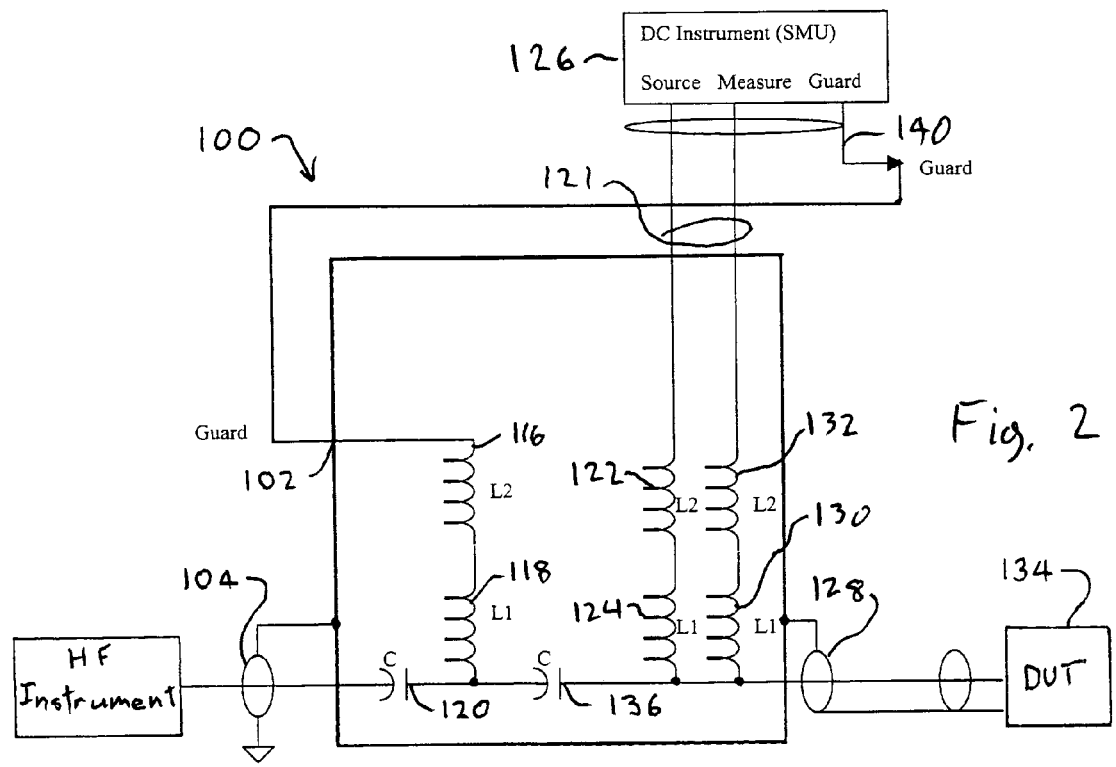
FIG. 2 is a schematic diagram of an example of a bias tee according to an aspect of the invention.

Referring to the example of FIG. 2, a bias tee 100 includes a guard input 102. The guard input 102 is connected to the HF port 104 of the bias tee 100 by an impedance network formed from the inductors 116, 118 and the capacitor 120. The DC instrument 126 is connected to the DC port 121 of the bias tee 100. The inductors 122, 124 connect the source output of the DC instrument 126 to the output port 128 of the bias tee 100. The inductors 130, 132 connect the measure input of the instrument 126 to the output port 128.

In operation, the output port 128 applies both DC and HF to the DUT 134. The capacitor 136 allows HF to travel to the port 128 and the inductors 122, 124, 130, 132 block HF from the instrument 126.

The capacitor 120 blocks DC from the guard input 102 from entering the instrument 126 and the inductors 116, 118 block HF from the guard input 102.

The guard output 140 of the DC instrument 126 is typically driven at a voltage equal to the forcing voltage of the DC instrument 126 (which is the nature of guards), as a result in this case, there will be no DC potential across the capacitor 136 and, hence, no leakage across the capacitor 136.

This guarding of the HF port 128 results in substantial improvements in the measurement sensitivity of the DC instrument 126. For example, from nanoamperes to pico-amperes.

It should be pointed out that because of the high frequency content of fast rise/fall time pulses, the above circuit is suitable for not only RF signals, but also for pulsed signals as well. In addition, in many cases, the inductors of the bias tee may be replaced with resistors where the resistive impedance is sufficient to limit the HF component through the instrument 126.

Figure 3:
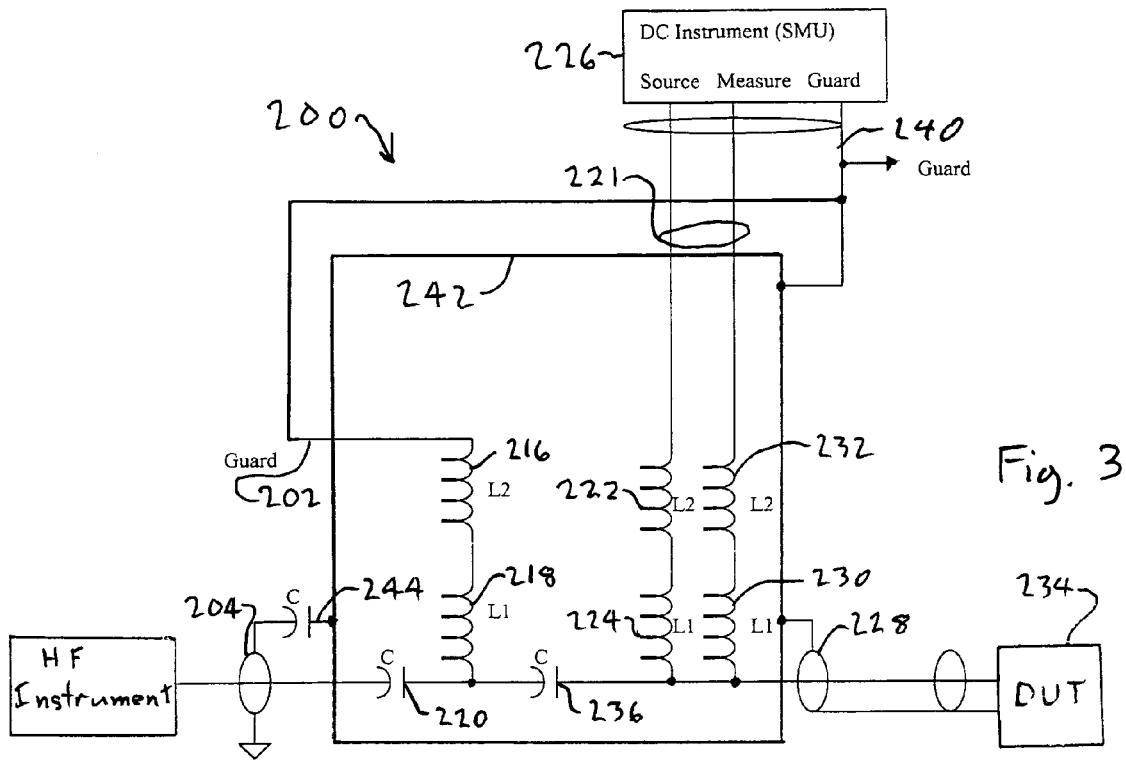
FIG. 3 is a schematic diagram of another example of a bias tee according to another aspect of the invention.

Referring to the example of FIG. 3, another bias tee 200 includes a guard input 202. The guard input 202 is connected to the HF port 204 of the bias tee 200 by an impedance network formed from the inductors 216, 218 and the capacitor 220. The DC instrument 226 is connected to the DC port 221 of the bias tee 200. The inductors 222, 224 connect the source output of the DC instrument 226 to the output port 228 of the bias tee 200. The inductors 230, 232 connect the measure input of the instrument 226 to the output port 228. In addition, the bias tee 200 is located within a conductive enclosure 242 (e.g., a metal box) where the enclosure 242 is connected to the guard input 202. The HF port 204 includes a DC isolation capacitor 244 to isolate the guard potential from the HF ground.

Similar to the previous example, the output port 228 applies both DC and HF to the DUT 234. The capacitor 236 allows HF to travel to the port 228 and the inductors 222, 224, 230, 232 block HF from the instrument 226.

The capacitor 220 blocks DC from the guard input 202 from entering the instrument 226 and the inductors 216, 218 block HF from the guard input 202.

The guard output 240 of the DC instrument 226 is typically driven at a voltage equal to the forcing voltage of the DC instrument 226 (which is the nature of guards), as a result in this case, there will be no DC potential across the capacitor 236 and, hence, no leakage across the capacitor 236. In addition, the connection of the guard to the enclosure 242 minimizes any DC potential between the enclosure 242 and the forcing voltage of the DC instrument 226. This further minimizes leakage within the bias tee 200, as the effect of stray capacitances to the enclosure are minimized.

This guarding of the HF port 228 results in substantial improvements in the measurement sensitivity of the DC instrument 226. For example, from nanoamperes to femto-amperes.

It should be pointed out that because of the high frequency content of fast rise/fall time pulses, the above circuit is suitable for not only RF signals, but also for pulsed signals as well. In addition, in many cases, the inductors of the bias tee may be replaced with resistors where the resistive impedance is sufficient to limit the HF component through the instrument 226.

Figure 1:
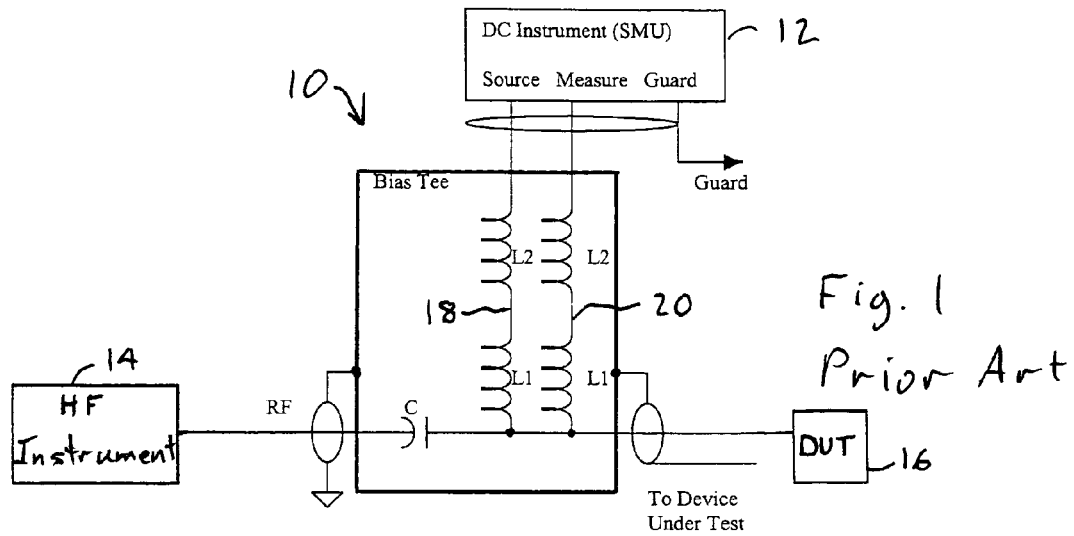
FIG. 1 is a schematic diagram of a prior art bias tee.
Figure 4:
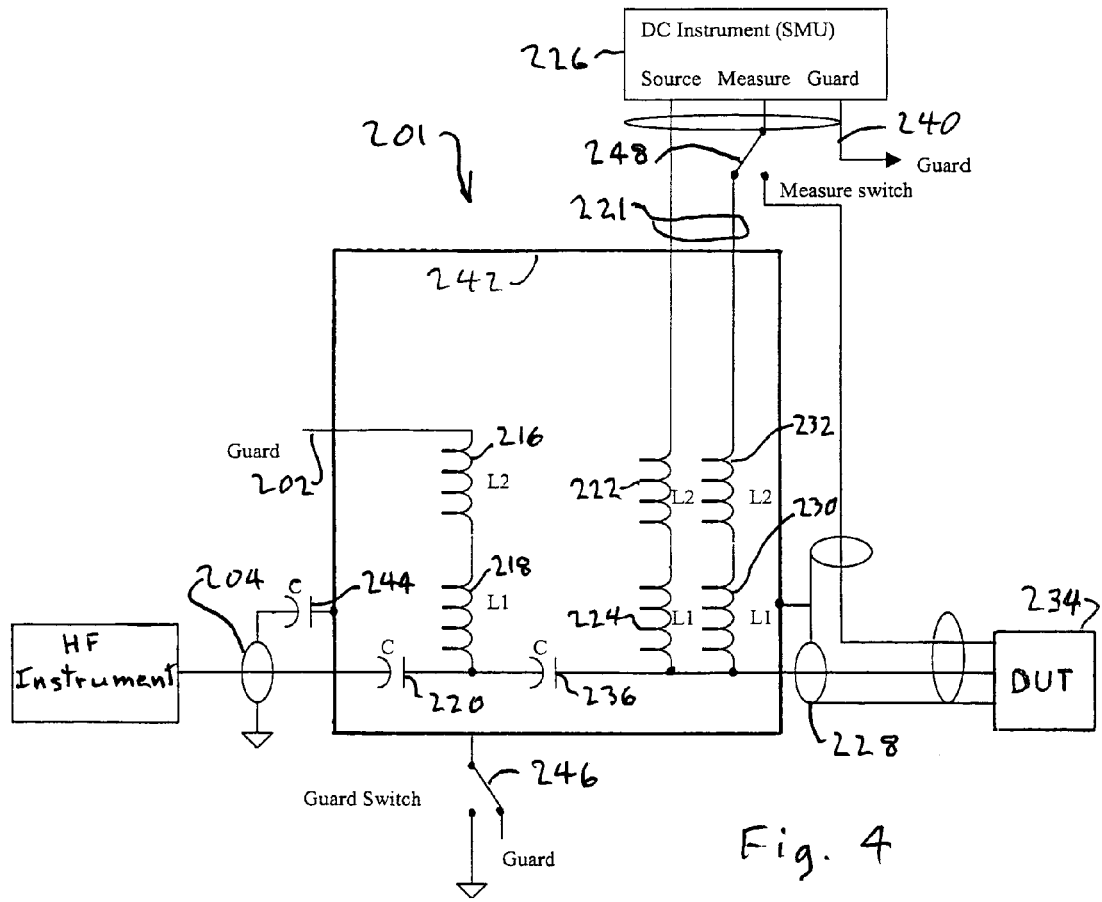
FIG. 4 is a schematic diagram of still another example of a bias tee according to still another aspect of the invention.

Referring to the example of FIG. 4, a bias tee 201 similar to the bias tee 200 further includes a guard switch 246 that switches the enclosure 242 between ground or guard potential and a measure switch 248 that allows the Kelvin connection to be made either within the bias tee 201 or at the DUT 234 itself. Having the enclosure 242 at ground is useful when RF measurements are the primary interest and having the Kelvin connection at the DUT may be important in some tests.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A bias tee for connecting a measurement device to a DUT, said measurement device having a guard output, said bias tee comprising:
   a DC port;
   a HF port;
   a guard input; and
   a measurement port, said HF port being guarded when said guard output is connected to said guard input, the potential of said guard input effectively cancelling capacitive leakage between said HF port and said measurement port.

2. A bias tee according to claim 1, wherein said HF port is connected to said guard input through an impedance network.

3. A bias tee according to claim 2, wherein said impedance network includes a RC network.

4. A bias tee according to claim 2, wherein said impedance network includes a LC network.

5. A bias tee according to claim 1, wherein said bias tee has a conductive enclosure and said HF port includes a DC ground block, said enclosure being connected to said guard output during operation of the bias tee.

6. A bias tee according to claim 1, wherein said HF port is adapted to radio frequency input signals.

7. A bias tee according to claim 1, wherein said HF. port is adapted to pulsed input signals.

* * * * *